(12) United States Patent
Kang (10) Patent No.: US 6,704,240 B2
(45) Date of Patent: Mar. 9, 2004

(54) PREDECODER CONTROL CIRCUIT

(75) Inventor: Byung-Joo Kang, Ichon-shi (KR)

(73) Assignee: Hynix Semiconductor Inc., Khyoungki-Do (KR)

( * ) Notice: Subject to any disclaimer, the term of this patent is extended or adjusted under 35 U.S.C. 154(b) by 58 days.

(21) Appl. No.: 10/029,257

(22) Filed: Dec. 28, 2001

(65) Prior Publication Data

US 2002/0105851 A1 Aug. 8, 2002

(30) Foreign Application Priority Data

Dec. 29, 2000 (KR) ......................................... 2000-85451

(51) Int. Cl.[7] ................................................ G11C 7/00
(52) U.S. Cl. .................................. 365/230.06; 365/194
(58) Field of Search ............................ 365/230.06, 194, 365/189.05, 230.08

(56) References Cited

U.S. PATENT DOCUMENTS 5,969,981 A * 10/1999 Kono .......................... 365/145
6,396,761 B2 * 5/2002 Noda et al. ................. 365/227

* cited by examiner

*Primary Examiner*—Vu A. Le
(74) *Attorney, Agent, or Firm*—Birch, Stewart, Kolasch & Birch, LLP (57) ABSTRACT

A predecoder control circuit outputs a first and a second predecoder control signals of a pulse type without outputs of a first and second predecoder level signals so that an error generated by overlapping of the predecoder address signals can be prevented.

7 Claims, 9 Drawing Sheets

PREDECODER CONTROL CIRCUIT

FIELD OF THE INVENTION

The present invention relates to a predecoder; and, more particularly, to a predecoder capable of preventing an error of column addresses generated by overlapping of predecoder addresses.

DESCRIPTION OF THE PRIOR ART

Recently, a memory device requires not only a low-power consumption and a high-speed performance, but also a stable characteristic thereof. However, as a frequency is increased, there are limitations for a stable operation of the memory device and for a timing margin of internal logics.

Figure 1:
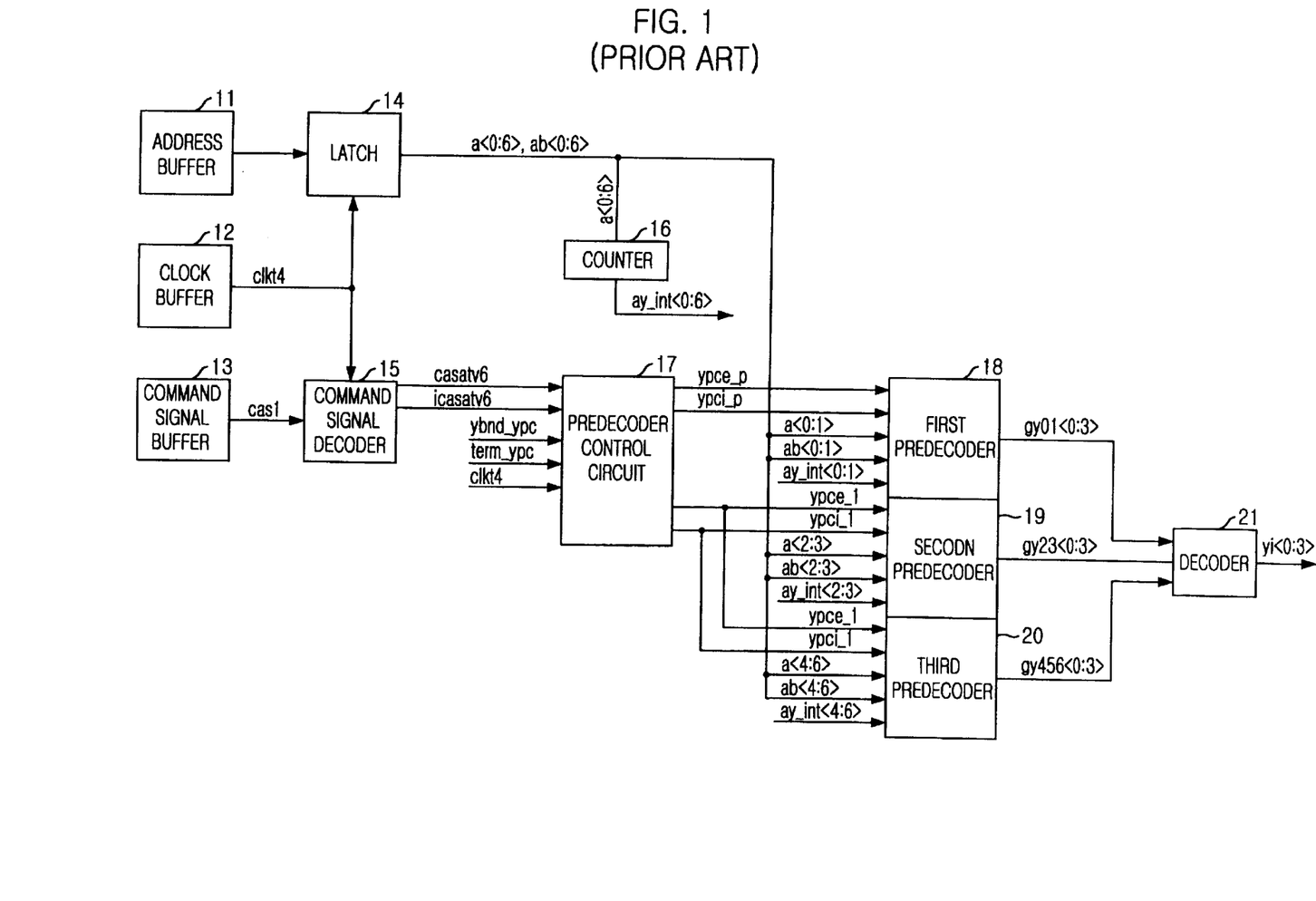
FIG. 1 is a block diagram showing a path for outputting a column address signal in the semiconductor memory device according to the prior art.

FIG. 1 is a block diagram showing a path for outputting column address in semiconductor memory device according to the prior art.

Referring to FIG. 1, an address signal (add) inputted through an address buffer 11 and a column address strobe signal (cas1) inputted through a command signal buffer 13 are synchronized with an internal clock signal (clkt4) inputted through a clock buffer 12 in a latch 14 and a command signal decoder 15 respectively. Address signals a<0:6> and ab<0:6> passing through the latch 14 are inputted into a first, second, and third predecoders 18, 19 and 20. A counter 16, in which address signals a<0:1> are inputted, outputs counting signals (ay_int<0:6>) and the counting signals (ay_int<0:6>) are inputted into the first, second and third predecoders 18, 19 and 20. The command signal decoder 15 outputs a read/write signal (casatv6) and a signal corresponding to a burst length determined by the read/write signal (casatv6) and those are inputted into a predecoders control circuit 17. The predecoder control circuit 17 receives the read/write signal (casatv6) the signal corresponding to a burst length, a plurality control signals (ybnd_ypc and term_ypc) and the internal clock signal (clk4) and outputs a first and second predecoder control signals (ypce_p and ypci_p) and a first and second predecoder level signals (ypce_l and ypci_l) and these signals outputted from the predecoder control circuit 17 are inputted into the first, second and third predecoder 18, 19 and 20. The first predecoder 18 receives the first and second control signals (ypce_p and ypci_p), the address signals (a<0:1> and ab<0:1>), which represent address signals from 0 to 1, and the counting signals (ay_int<0:1>), which represent counting signals form 0 to 1, and outputs first predecoder signals (gy01<0:3>). The second predecoder 19 receives the first and second predecoder level signals (ypce_l and ypci_l), the address signals (a<2:3> and ab<2:3>) and the counting signals (ay_int<2:3>) and outputs second predecoder signals (gy23<0:3>). The third predecoder 20 receives the first and second predecoder level signals (ypce_l and ypci_l), the address signals (a<4:6> and ab<4:6>) and the counting signals (ay_int<4:6>) and outputs third predecoder signals (gy456<0:7>). A decoder 21 receiving the output signals of the first, second and third predecoders 18, 19 and 20 outputs column address signals (yi<0:3>).

As shown in the above layout, the predecoder has been used to reduce the number of transistors in outputting the column address signal. At this time, the address signals are grouped to some of address signals and the number of cases capable of grouping address signals is calculated. In the SDRAM, address signals, which are applied from an external circuit, are changed into internal address signals by a counter and then a burst operation of the internal address signals is performed. Address 0 and address 1 signals are grouped so that a signal of pulse type is generated in the first predecoder and addresses 2 and 3 signals, addresses 3 and 4 signals and addresses 5 and 6 signals are changed into signals of a level type in the second and third predecoder. The signals of pulse type and the signals of level type are used as predecoder signals.

Figure 2:
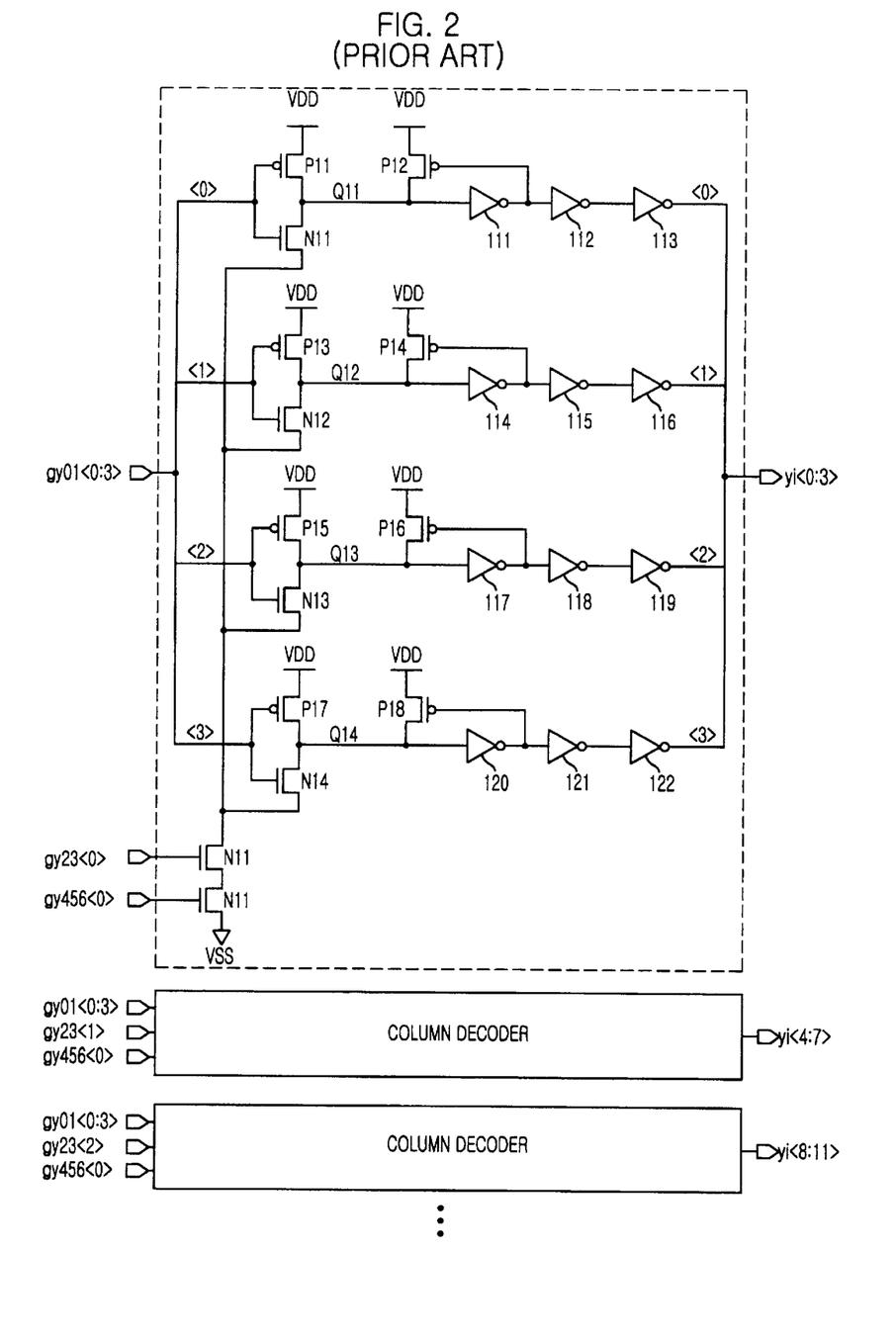
FIG. 2 is a circuit diagram illustrating a decoder according to the prior art.

FIG. 2 is a circuit diagram showing a decoder according to the prior art. A dynamic is used to reduce an area of decoder.

Referring to FIG. 2, the first predecoder signals (gy01<0:3>) are inputted with an identical address input path into each decoder. Now, an input path of address 0 signal (<0>) will be, for example, described.

A first PMOS transistor P11, which is driven in response to the address 0 signal, is connected to a power supply voltage VDD terminal and a first node Q11. A first NMOS transistor N11, which is driven in response to the address 0 signal (gy01<0>) of the first predecoder 18, is connected between the first node Q11 and a ground voltage VSS terminal. A fifth NMOS transistor N15 driven in response to the address 0 signal (gy23<0>) of the second predecoder 19 and a sixth NMOS transistor driven in response to the address 0 signal (gy456<0>) of the third predecoder 20 are connected in series. A second PMOS transistor P12, which is driven in response to an output signal of an inverter I11, is connected to the supply voltage VDD terminal and the first node Q11. A potential of the first node Q11 is inverted and delayed in passing through the first, second and third inverters I11, I12 and I13 and column address signals (yi<0:3>) are outputted.

In order to drive the above decoder, the fifth and sixth NMOS transistors N15 and N16 are turned on at the same time. The address 2, 3, 4, 5, and 6 signals have to be inputted in the decoder in advance for the address signals to perform a burst operation. The address 0 and 1 signals are inputted with a pulse type and the address 2 and 3 signals and the address 4, 5 and 6 signals are inputted with a level type such as the prior art. The signal of level type is transited one time so that a current consumption is low, however, a large margin is required. It is disadvantageous for a time to access a column address.

Figure 3:
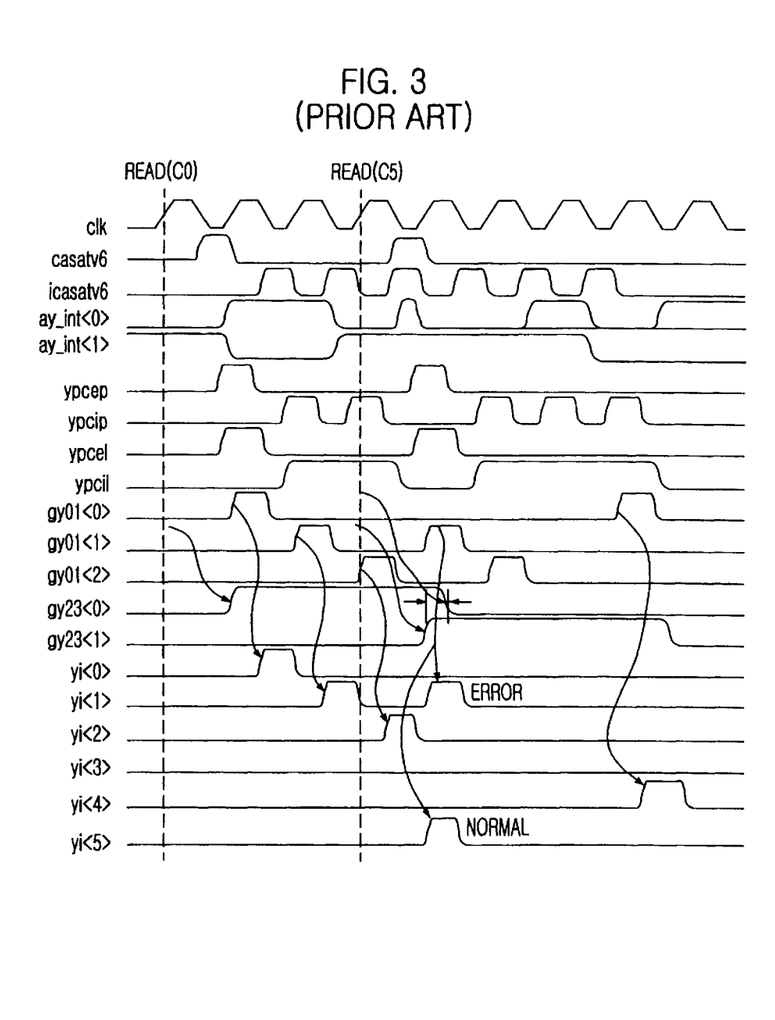
FIG. 3 is a timing diagram showing a read interrupt according to the prior art.

FIG. 3 is a timing diagram showing a read interrupt according to the prior art.

Referring to FIG. 3, when the address 1 signal (gy23<1>) of the second predecoder is enabled, the address 0 signal (gy23<0>) has to be disabled; however, two address signals (gy23<1> and gy23<0>) may be overlapped so that two column address signals may be outputted. As shown in FIG. 3, the column address 1 signal (yi<1>) and the column address 5 signal (yi<5>) are outputted at the same time. To prevent the above problem, an enable time of the predecoded address signal has to be delayed to secure an enough margin; however, an access time loss of column address signal is generated.

SUMMARY OF THE INVENTION

It is, therefore, an object of the present invention to provide a predecoder control circuit, which can prevent an error of column address signals generated by overlapping of predecoder address signals and secure an enough margin without an access time loss of column address signals.

In accordance with an aspect of the present invention, there is provided a predecoder control circuit comprising: a first inversion delay means for inverting and delaying a first control signal as much as a predetermined time; a first latch means for determining potential of a first node by inverting and latching an output signal of the first inversion delay means; a second inversion delay means for inverting and delaying the potential of the first node; a third inversion delay means for logically combining a second control signal and a third control signal and delaying the logically combined signal as much as a predetermined time; a second latch means for determining potential of a second node by inverting and latching an output signal of the third inversion delay means; a fourth inversion delay means for inverting and delaying potential of the second node; a switching means for adjusting potential of a third node in response to a fourth control signal and a clock signal; a third latch means for latching potential of the third node; a first logic means for logically combining an output signal of the second inversion delay means and an output signal of the third latch means and outputting a first predecoder control signal; and a second logic means for logically combining an output signal of the fourth inversion delay means and an output signal of the third latch means and outputting a second predecoder control signal.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE PREFERRED EMBODIMENTS

Hereinafter, a predecoder control circuit capable of preventing an error of column address signal generated by overlapping of predecoder address signals will be described in detail referring to the accompanying drawings.

Figure 4:
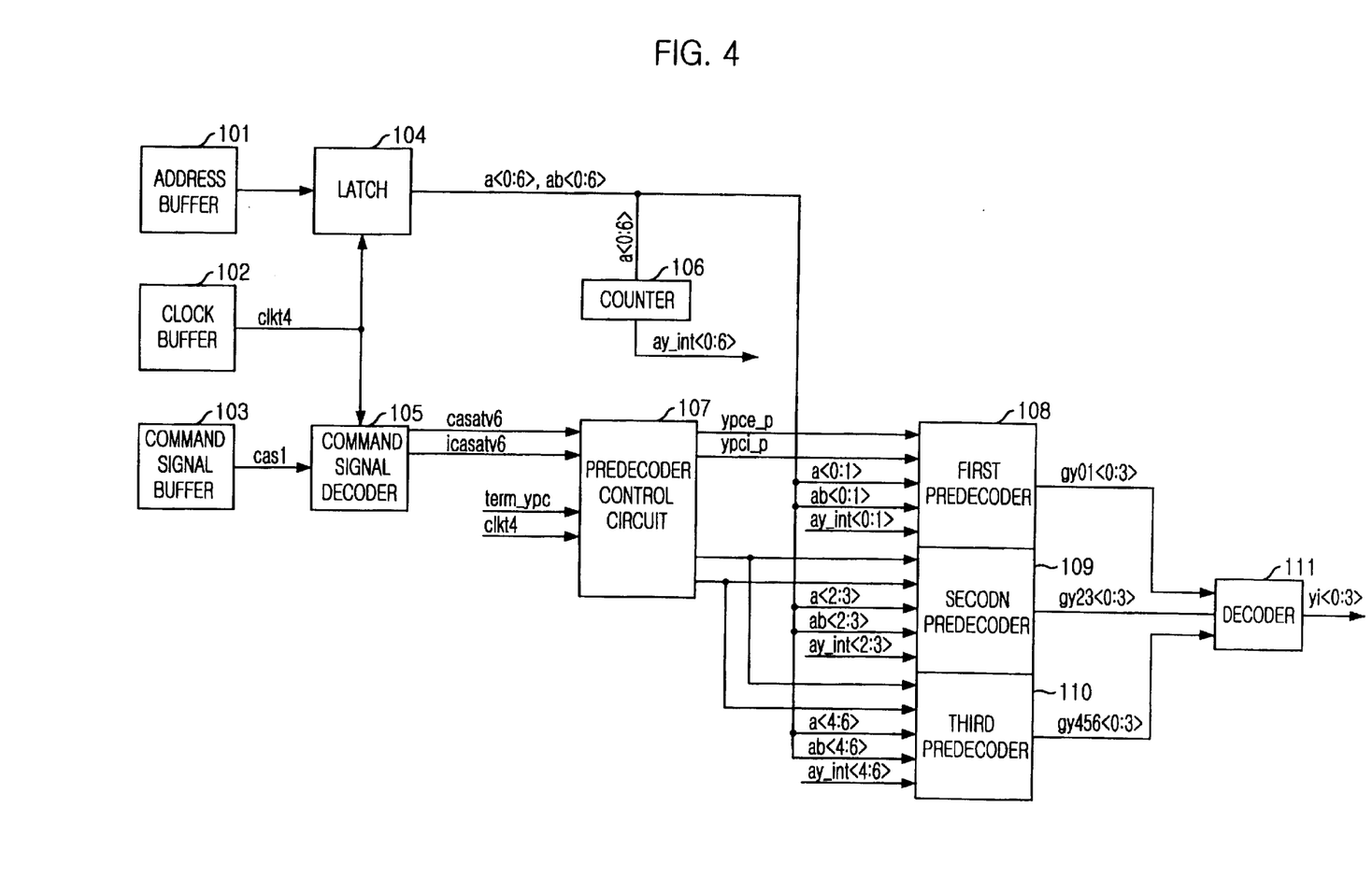
FIG. 4 is a block diagram showing an output path of column address signal according to the present invention.

FIG. 4 is a block diagram showing an output path of column address signal (yi<0:3>) according to the present invention.

Referring to FIG. 1, an address signal (add) inputted through an address buffer 101 and a column address strobe signal (cas1) inputted through a command signal buffer 103 are synchronized with an internal clock signal (clkt4) inputted through a clock buffer 102 in a latch 104 and a command signal decoder 15 respectively. Address signals a<0:6> and ab<0:6> passing through the latch 104 are inputted into a first, second, and third predecoders 108, 109 and 110. A counter 106, in which address signals (a<0:1>) are inputted, outputs counting signals (ay_int<0:6>) and the counting signals (ay_int<0:6>) are inputted into the first, second and third predecoders 108, 109 and 110. The command signal decoder 105 outputs a read/write signal (casatv6) and a signal (icasatv6) corresponding to a burst length determined by the read/write signal (casatv6) and these signals are inputted into a column predecoders control circuit 107. The column predecoder control circuit 107 receives the read/write signal (casatv6), the signal (icasatv6) corresponding to a burst length, a control signal (term_ypc) and the internal clock signal (clkt4) and outputs a first and second predecoder control signals (ypce_p and ypci_p). These signals outputted from the predecoder control circuit 17 are inputted the first, second and third predecoders 108, 109 and 110.

According to the present invention, a control signal (ybnd_ypc), which is inputted into the predecoder control circuit in the prior art, is not inputted into the column predecoder control circuit 107 and, also, a first and second predecoder level signals (ypce_l and ypci_l) are not outputted from the column predecoder control circuit 107. The first and second predecoder control signals (ypce_p and ypci_p), the address 0 and 1 signals (a<0:1> and ab<0:1>) and the counting 0 and 1 signals (ay_int<0:1>) are inputted into the first predecoder 108 and the first predecoder 108 outputs first predecoder signals (gy01<0:3>).

The first and second predecoder control signals (ypce_p and ypci_p), the address 2 and 3 signals (a<2:3> and ab<2:3>) and the counting 2 and 3 signals (ay_int<2:3>) are inputted into the second predecoder 109 and the second predecoder 109 outputs second predecoder signals (gy23<0:3>).

The first and second predecoder control signals (ypce_p and ypci_p), the address 4, 5 and 6 signals (a<4:6> and ab<4:6>) and the counting 4, 5 and 6 signals (ay_int<4:6>) are inputted into the third predecoder 110 and the third predecoder 110 outputs third predecoder signals (gy456<0:7>).

The first, second and third predecoder signals (gy01<0:3>), gy23<2:3> and gy456<0:7>) are inputted into a decoder 111 and then the column address signals (yi<0:3>) are outputted from the decoder 111. The first and second predecoder level signals (ypce_1 and ypci_1) are not inputted into the second and third predecoders 109 and 110 and only the first and second predecoder control signals (ypce_p and Ypci_p) are outputted, which are different from the prior art.

Figure 5A:
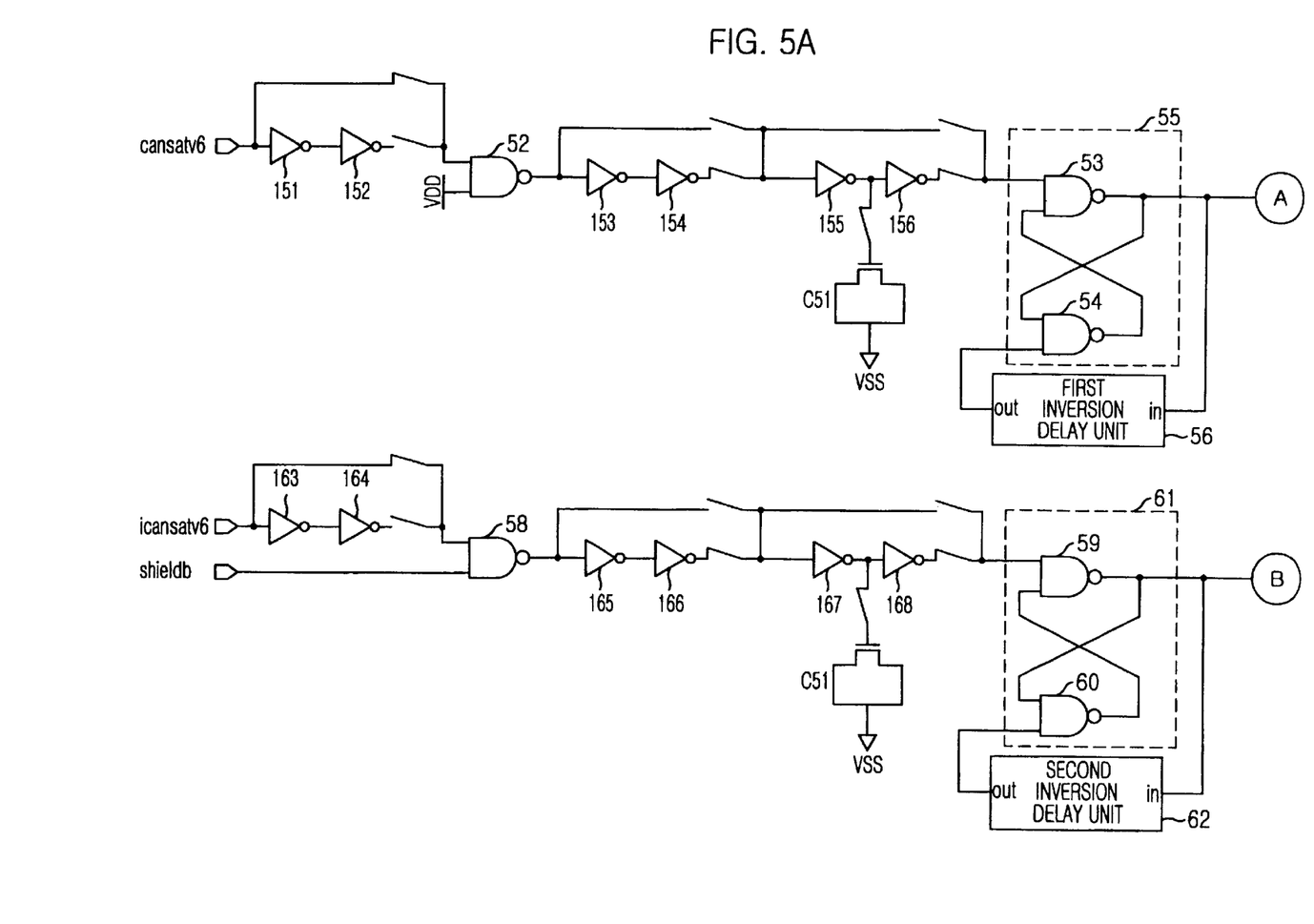
FIGS. 5A and 5B are the predecoder control circuits according to the present invention.
Figure 5B:
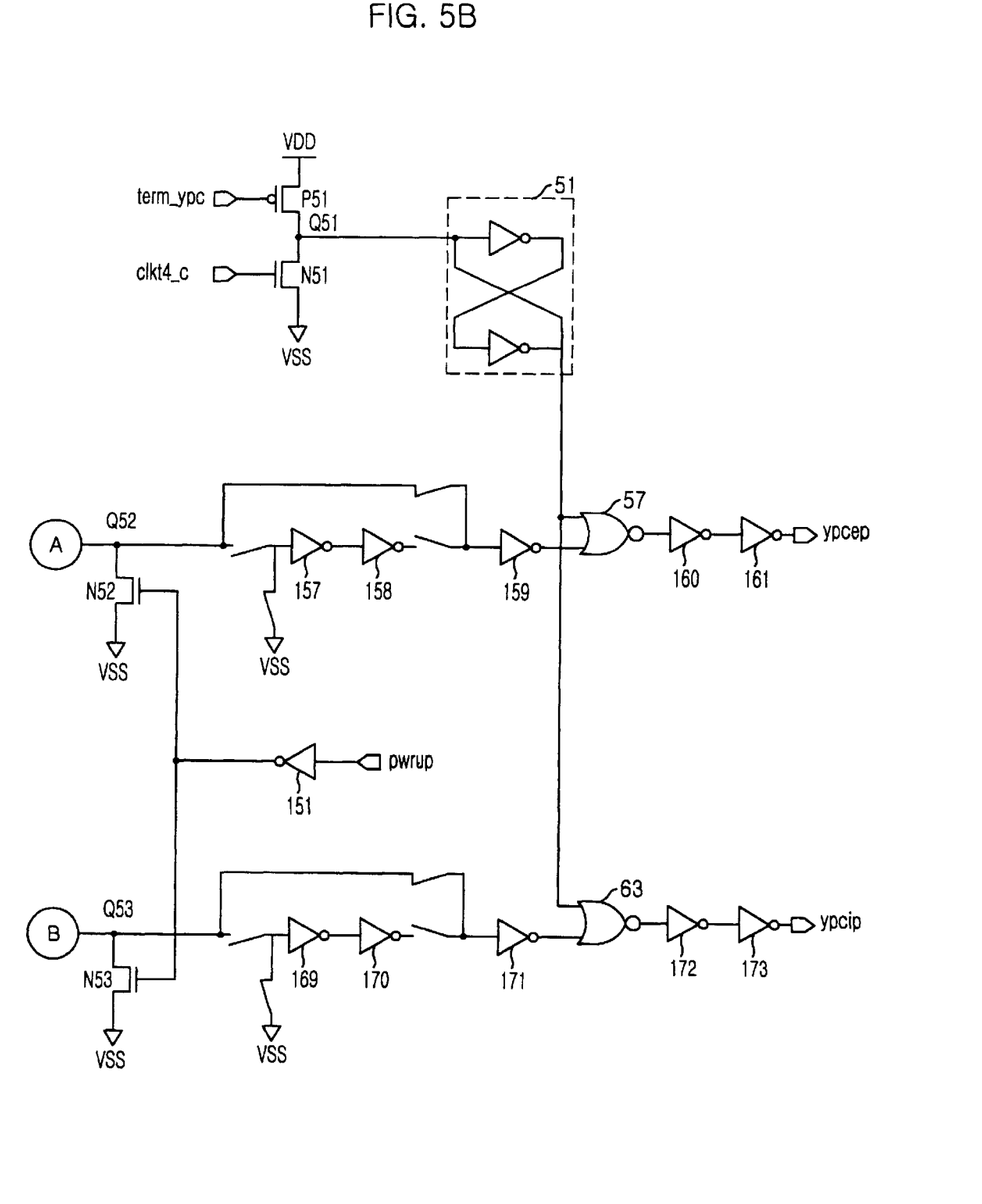

FIGS. 5A and 5B are the predecoder control circuit according to the present invention.

Referring to FIG. 5B, when a precharge signal is applied in a corresponding column operation, a first PMOS transistor P51, which is driven in response to the control signal (term_ypc) applying interrupt, is connected to a power supply voltage VDD terminal and a first node (Q51). A first NMOS transistor N51, which is driven in response to the clock signal (clkt4), is connected to the first node (Q51) and a ground voltage VSS terminal. A first latch circuit 51 includes two inverters and latches potential of the first node (Q51). An output signal of the first latch circuit 51 is inputted into one input terminal of a first and second NOR gates 57 and 63.

Referring to FIG. 5A, a first control signal (casatv6) delayed through a first and second inverters I51 and I52 is inputted into one input terminal of a first NAND gate 52 and the power supply voltage VDD is applied into the other input terminal of the first NAND gate 52. An output signal of the first NAND gate 52 is delayed through a first to sixth inverters I53 to I56 and inputted into one input terminal of a second NAND gate 53. A first capacitor C51 is connected between an output terminal of the fifth inverter I55 and a ground voltage VSS terminal. The output of the sixth inverters I56 is inputted into one input terminal of the second NAND gate 53 and a feedback signal, which is an output signal of a third NAND gate 54, is inputted the other input terminal of the second NAND gate 53. An output signal of the second NAND gate 53 is inputted into one input terminal of the third NAND gate 54 and a delayed signal of the output signal of the second NAND gate 53 in a first inversion delay unit 56 is inputted into the other input terminal of the third NAND gate 54.

A second latch circuit 55 is configured with the second and third NAND gates 53 and 54. A second NMOS transistor N52, which is driven in response to a power up signal (pwrup) inverted through a twelfth inverter I62, is connected to a second node Q52, which is an output terminal of the second latch circuit 55, and a ground voltage VSS terminal. An output signal of the second latch circuit 55 is inverted and delayed through seventh to ninth inverters I57 to I59 and is inputted into one input terminal of a first NOR gate 57. The first NOR gate 57 receives the output signals of the first and second latch circuits 51 and 55. An output signal of the first NOR gate 57 is delayed by passing trough tenth and eleventh inverters I60 and I61 and is outputted as the first predecoder control signal (ypcep).

The second control signal (icasatv6) is delayed through inverters thirteenth and fourteenth inverters I63 and I64 and is inputted into one input terminal of a fourth NAND gate 58. A shield bar signal (shieldb) is inputted into the other input terminal of the fourth NAND gate 58. The shield bar signal (shieldb) plays a role of preventing that the first control signal (casatv6) is applied when the second control signal (icasatv6) is applied. An output signal of the fourth NAND gate 58 is delayed through inverters fifteenth to eighteenth inverters I65 to I68 and is inputted into one input terminal of a fifth NAND gate 59. A second capacitor C52 is connected between the output terminal of the seventeenth inverters I67 and a ground voltage VSS terminal.

The output of the eighteenth inverters I68 is inputted into one input terminal of the fifth NAND gate 59 and a feed back signal, which is an output signal of a sixth NAND gate 60, is inputted the other input terminal of the fifth NAND gate 59. An output signal of the fifth NAND gate 59 is inputted into one input terminal of the sixth NAND gate 60 and a delayed signal of the output signal of the fifth NAND gate 59 in a second inversion delay unit 62 is inputted into the other input terminal of the sixth NAND gate 60.

A third latch circuit 61 is configured with the fifth and sixth NAND gates 59 and 60. A third NMOS transistor N52, which is driven in response to a power up signal (pwrup) inverted by a twelfth inverter I62, is connected to a third node Q53, which is an output terminal of the third latch circuit 61, and a ground voltage VSS terminal. An output signal of the second latch circuit 61 is inverted and delayed through nineteenth to twenty first inverters I69 to I71 and is inputted into one input terminal of a second NOR gate 63. The second NOR gate 63 receives the output signals of the first and third latch circuits 51 and 61. An output signal of the second NOR gate 57 is delayed by passing trough twenty second and twenty third inverters I72 and I73 and is outputted as the second predecoder control signal (ypcip).

Figure 6:
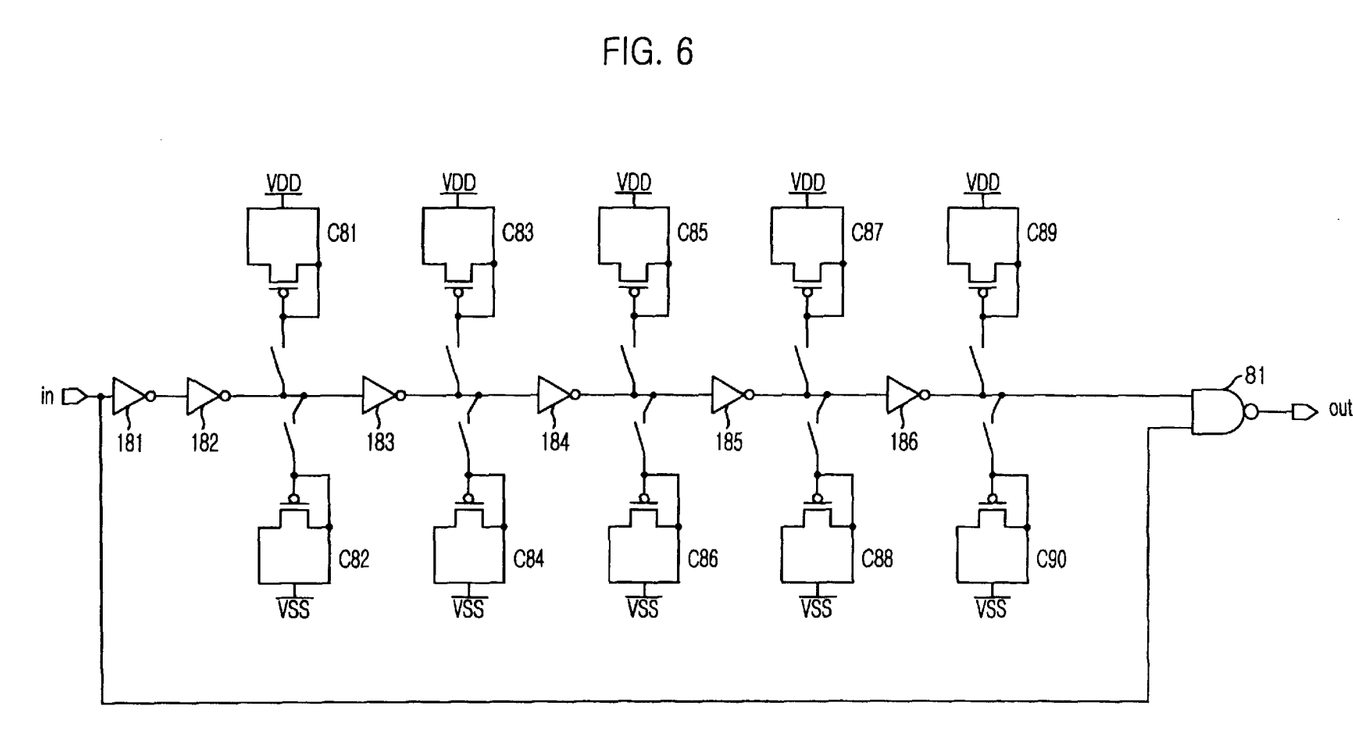
FIG. 6 is a circuit diagram showing an inversion delay unit according to the present invention.

FIG. 6 is a circuit diagram showing the first and second inversion delay units 56 and 62.

Referring to FIG. 6, the inversion delay units 56 and 62 include a plurality of inverters I81 to I86 and a NAND gate 81. An input signal (in) and a delayed input signal (in) are inputted into the NAND gate 81. Also, the inversion delay unit includes a plurality of capacitors C81 to C90, which are connected between the inverters.

Figure 7:
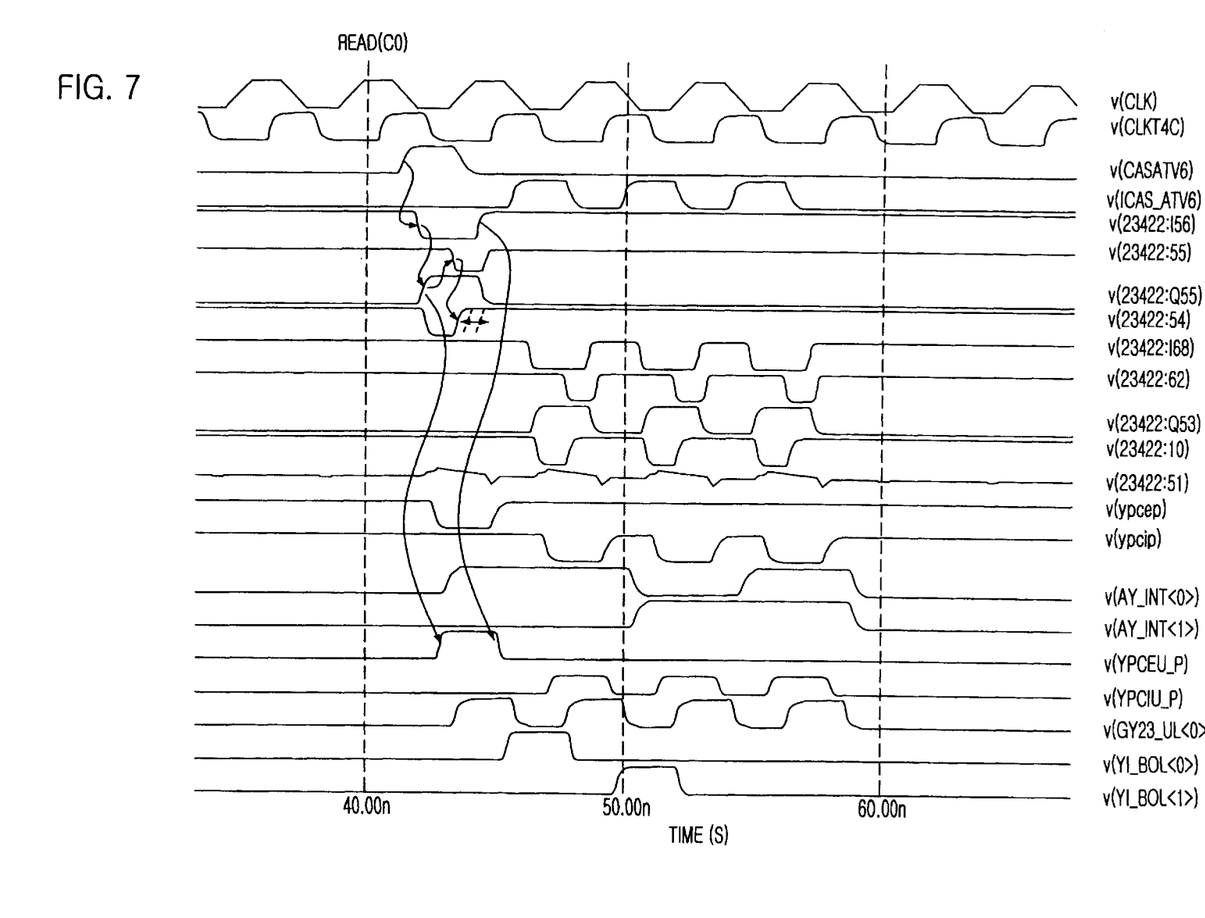
FIG. 7 is a timing diagram of the predecoder control circuit according to the present invention.

FIG. 7 is a timing diagram of the predecoder control circuit according to the present invention.

When the power up signal (pwrup) is not applied, that is, the power up signal (pwrup) is a logic 'low' state, the power up signal (pwrup) is inverted into a logic 'high' state by passing trough the twelfth inverters I62 so that the first and second NMOS transistors N52 and N53 are turned on. Accordingly, the second and third nodes Q52 and Q53 are maintained in a logic 'low' state. The first and predecoder control signals (ypcep and ypcip) are outputted with a logic 'low' state.

If the power up signal (pwrup) is transited into a logic 'high' state, the power up signal (pwrup) is inverted into a logic 'low' state through the twelfth inverter I62 so that the second and third NMOS transistors N52 and N53 are turned off. At this time, if the first control signal (casatv6) is transited into a logic 'high' state, the first control signal (casatv6) is delayed through the first and second inverters I51 and I52 and inputted into the first NAND gate 52 together with power supply voltage VDD so that the first NAND gate 52 outputs a signal of a logic 'low' level. The output signal of the first NAND gate 52 is delayed through the third to sixth inverters I53 to I56 and the delayed signal, which is a logic 'low' state, is inputted into the second NAND gate 53. Also, the second NAND gate 53 receives the output signal of the third NAND gate 54, which is a logic 'high' state so that the second NAND gate 53 outputs signal of a logic 'high' state.

The third NAND gate 54 receives the output signal of the second NAND gate 53, which is a logic 'high' state, and a signal, which the output signal of the second NAND gate 53 is delayed as much as a predetermined time in the first conversion delay unit 56, and then the third NAND gate 54 outputs a signal of a logic 'high' state. The output signal of the third NAND gate 54 is inputted into one input terminal of the second NAND gate 53. The second latch circuit 55 outputs a signal of a logic 'high' state through the operations of the second and third NAND gates 53 and 54. The second node Q52 is maintained with a logic 'high' state by the output signal of the second latch circuit 55.

The potential of the second node Q52, which is a logic 'high' state, is inverted into a potential of a logic 'low' state through the seventh to ninth inverters I57 to I59 and then the signal of a logic 'low' state is inputted into the first NOR gate 57. At this time, the third control signal (term_ypc) is applied with a logic 'high' state so that the first PMOS transistor P51 is turned off and the clock signal (clkt4) is applied with a logic 'high' state so that the first NMOS transistor N51 is turn on and a potential of the first node Q51 is maintained with a logic 'low' state. The potential of the first node Q51, which is a logic 'low state', is latched at the first latch circuit 51 and an output signal of the first latch circuit 51, which is a logic 'low' state, is inputted into the first NOR gate 57. Since the first NOR gate 57 receives two signals of a logic 'low' state, the output signal of the NOR gate 57 is a signal of a logic 'high' state. The output signal of the first NOR gate 57 is delayed through the tenth and eleventh inverters I60 and I61 and is outputted as the first predecoder control signal (ypcep). A width of the first predecoder control signal (ypcep) is adjusted by the first inversion delay unit 56. When the potential of the second node Q52 is transited into a logic 'high' state, the first conversion delay unit 56 delays the signal of the logic 'high' as much as a predetermined time and outputs a signal of a logic 'low' state. When the potential of the second node Q52 is transited into a logic 'low' state, the signal of the second node Q52 is delayed and inverted by the first inversion delay unit 56 so that a signal of a logic 'high' state is outputted. If capacitors are appropriately connected between the inverters as shown in FIG. 6, a inversion delay time can be adjusted. Accordingly, when the first control signal (casatv6) is disabled to a logic 'low' state, a pulse of the second node Q52 can be adjusted so that the width of the first predecoder control signal (ypcep) can be adjusted. It is more effective in a short time of a clock cycle, that is, in a high frequency.

If the first control signal (casatv6) is transited into a logic 'low' state, the second control signal (icasatv6) is applied with a logic 'high' state. The second control signal (icasatv6) of the logic 'high' state is delayed through the thirteenth and fourteenth inverters I63 and I64 and inputted into the fourth NAND gate 58. Also, the fourth NAND gate 58 receives a shield bar signal applied with a logic 'high' state so that the fourth NAND gate 58 outputs a signal of a logic 'low' state since two signals of a logic 'high' state are inputted. The output signal of the fourth NAND gate 58, which is a logic 'low' state, is delayed through the fifteenth to eighteenth inverters I65 to I68 and inputted into the fifth NAND gate 59.

Also, the fifth NAND gate 59 receives the output signal of the sixth NAND gate 60, which is a logic 'high' state, so that the fifth NAND gate 59 outputs signal of a logic 'high' state.

The sixth NAND gate 60 receives the output signal of the fifth NAND gate 59, which is a logic 'high' state, and a signal, which the output signal of the fifth NAND gate 59 is delayed as much as a predetermined time in the second conversion delay unit 62, and then the sixth NAND gate 60 outputs a signal of a logic 'high' state. The output signal of the sixth NAND gate 60 is inputted into one input terminal of the fifth NAND gate 59. The third latch circuit 61 outputs a signal of a logic 'high' state through the operations of the fifth and sixth NAND gates 59 and 60. The potential of the third node Q53 is maintained with a logic 'high' state by the output signal of the third latch circuit 61.

The potential of the third node Q53, which is a logic 'high' state, is inverted into a potential of a logic 'low' state through the nineteenth to twenty first inverters I69 to I71 and then the signal of a logic 'low' state is inputted into the second NOR gate 63. At this time, the third control signal (term_ypc) is applied with a logic 'high' state so that the first PMOS transistor P51 is turned off and the clock signal (clkt4) is applied with a logic 'high' state so that the first NMOS transistor N51 is turn on and a potential of the first node Q51 is maintained with a logic 'low' state. The potential of the first node Q51, which is a logic 'low' state, is latched at the first latch circuit 51 and an output signal of the first latch circuit 51, which is a logic 'low' state, is inputted into the second NOR gate 63. Since the second NOR gate 63 receives two signals of a logic 'low' state, the output signal of the second NOR gate 63 is a signal of a logic 'high' state. The output signal of the second NOR gate 63 is delayed through the twenty second and twenty third inverters I72 and I73 and is outputted as the second predecoder control signal (ypcip). A width of the second predecoder control signal (ypcip) is adjusted by the second inversion delay unit 62.

Figure 8:
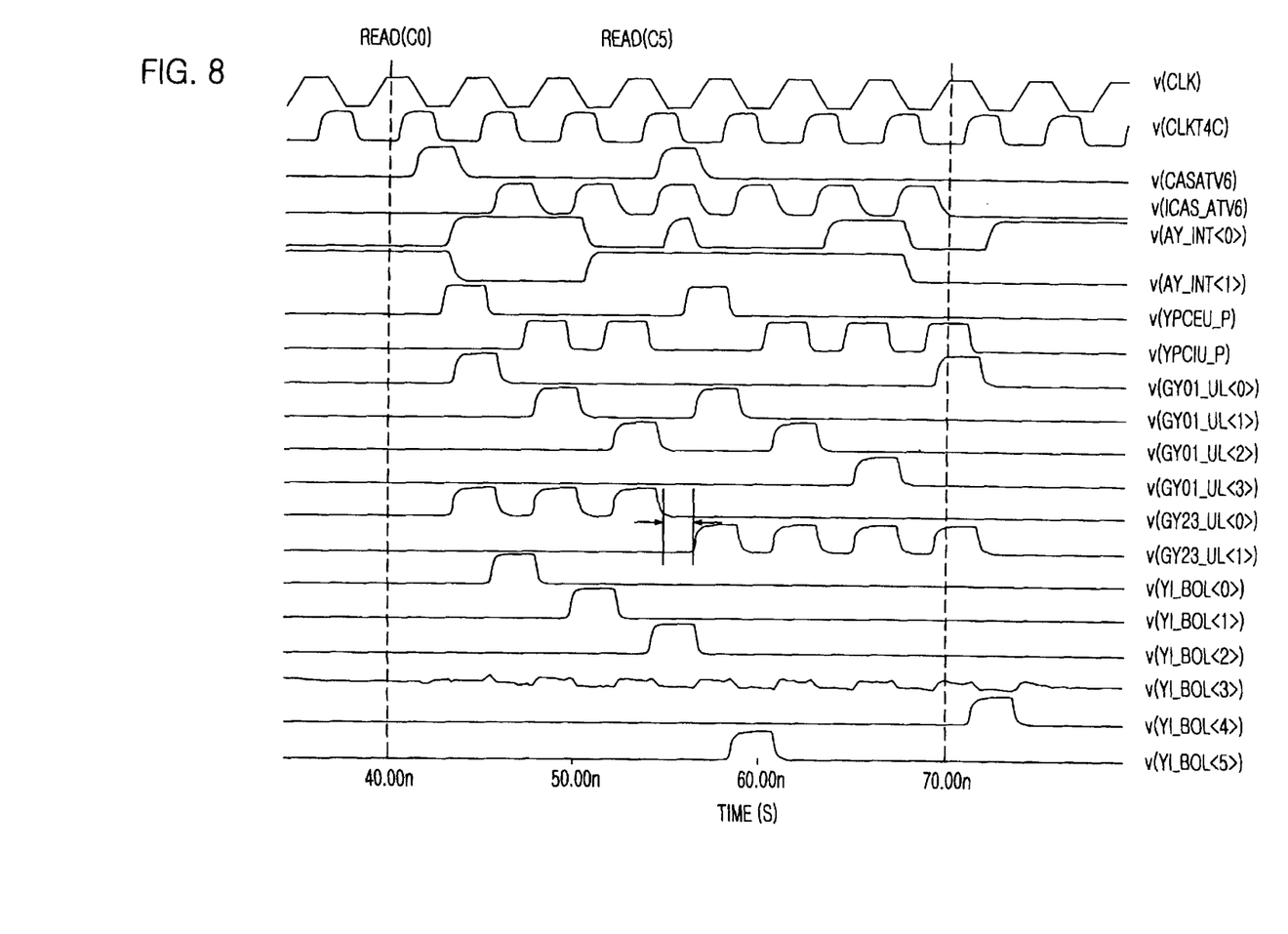
FIG. 8 is a timing diagram showing a simulation result of a column address output path when the predecoder control circuit is used according to the present invention.

FIG. 8 is a timing diagram showing a simulation result of a column address output path when the predecoder control circuit is used according to the present invention.

Referring to FIG. 8, the present invention prevents that two column address signals are outputted by overlapping of address signals of the conventional predecoder and a sufficient margin can be secured.

Accordingly, an error which is generated by overlapping the address signals of the predecoder can be prevented and a loss of an access time of column address signal generated by a lack of a margin for solving the above error is not generated.

While the present invention has been described with respect to the particular embodiments, it will be apparent to those skilled in the art that various changes and modifications may be made without departing from the spirit and scope of the invention as defined in the following claims.

What is claimed is:

1. A predecoder control circuit comprising:
   a first inversion delay means for inverting and delaying a first control signal as much as a predetermined time;
   a first latch means for determining potential of a first node by inverting and latching an output signal of the first inversion delay means;
   a second inversion delay means for inverting and delaying the potential of the first node;
   a third inversion delay means for logically combining a second control signal and a third control signal and delaying the logically combined signal as much as a predetermined time;
   a second latch means for determining potential of a second node by inverting and latching an output signal of the third inversion delay means;
   a fourth inversion delay means for inverting and delaying potential of the second node;
   a switching means for adjusting potential of a third node in response to a fourth control signal and a clock signal;
   a third latch means for latching potential of the third node;
   a first logic means for logically combining an output signal of the second inversion delay means and an output signal of the third latch means and outputting a first predecoder control signal; and
   a second logic means for logically combining an output signal of the fourth inversion delay means and an output signal of the third latch means and outputting a second predecoder control signal.

2. The predecoder control circuit as recited in claim 1, wherein the first inversion delay means includes:
   a plurality of inverters for delaying the first control signal;
   a first NAND gate for logically combining the first control signal delayed by the plurality of inverters and power supply voltage; and
   a plurality of inverters for delaying an output signal of the NAND gate.

3. The predecoder control circuit as recited in claim 1, wherein the first latch means includes:
   a second NAND gate receiving an output signal of the first inversion delay means and a predetermined signal;
   a fifth inversion delay means for delaying an output signal of the second NAND gate as much as a predetermined time; and
   a third NAND gate for logically combining the output signal of the second NAND gate and an output signal of the fifth inversion delay means and outputting a signal, which is the predetermined signal, to be inputted into the second NAND gate.

4. The predecoder control circuit as recited in claim 3, wherein the fifth inversion delay means includes:

a plurality of inverters for delaying an output signal of the second NAND gate; and a fourth NAND for logically combining an output signal of the second NAND gate and an output signal, which is delayed through the plurality of inverters, of the second NAND gate.

5. The predecoder control circuit as recited in claim 1, wherein the third inversion delay means includes:

a plurality of inverters for delaying the second control signal;

a fifth NAND gate for logically combining the second control signal delayed through the plurality of inverters and the third control signal; and a plurality of inverters for delaying an output signal of the fifth NAND gate.

6. The predecoder control circuit as recited in claim 1, wherein the second latch means includes:

a sixth NAND gate receiving an output signal of the third inversion delay means and a predetermined signal;

a sixth inversion delay means for delaying an output signal of the sixth NAND gate as much as a predetermined time; and a seventh NAND gate for logically combining the output signal of the sixth NAND gate and an output signal of the sixth inversion delay means and outputting a signal, which is the predetermined signal, to be inputted into the sixth NAND gate.

7. The predecoder control circuit as recited in claim 1, wherein the switching means includes:

a PMOS transistor, which is connected to a power supply terminal and the third node, driven in response to the fourth control signal; and an NMOS transistor, which is connected to the third node and ground, driven in response to the clock signal.

* * * * *